(12) United States Patent
Svensson et al.

(10) Patent No.: US 9,570,651 B2
(45) Date of Patent: *Feb. 14, 2017

(54) COALESCED NANOWIRE STRUCTURES WITH INTERSTITIAL VOIDS AND METHOD FOR MANUFACTURING THE SAME

(71) Applicant: GLO AB, Lund (SE)

(72) Inventors: Patrik Svensson, Palo Alto, CA (US); Linda Romano, Sunnyvale, CA (US); Sungsoo Yi, Sunnyvale, CA (US); Olga Kryliouk, Sunnyvale, CA (US); Ying-Lan Chang, Cupertino, CA (US)

(73) Assignee: GLO AB, Lund (SE)

( * ) Notice: Subject to any disclaimer, the term of this patent is extended or adjusted under 35 U.S.C. 154(b) by 0 days.

This patent is subject to a terminal disclaimer.

(21) Appl. No.: 14/688,364

(22) Filed: Apr. 16, 2015

(65) Prior Publication Data

US 2015/0221821 A1 Aug. 6, 2015

Related U.S. Application Data

(63) Continuation of application No. 13/626,286, filed on Sep. 25, 2012, now Pat. No. 9,035,278, which is a (Continued)

(51) Int. Cl.
*H01L 33/08* (2010.01)
*H01L 33/24* (2010.01)
(Continued)

(52) U.S. Cl.
CPC .............. *H01L 33/06* (2013.01); *H01L 29/068* (2013.01); *H01L 29/0676* (2013.01);
(Continued)

(58) Field of Classification Search
CPC .......... H01L 33/06; H01L 33/08; H01L 33/18; H01L 33/24; H01L 33/32; B82Y 20/00
See application file for complete search history.

(56) References Cited

U.S. PATENT DOCUMENTS 7,521,274 B2   4/2009   Hersee et al.
8,350,249 B1   1/2013   Svensson
(Continued)

FOREIGN PATENT DOCUMENTS

CN   101443887 A   5/2009
CN   101669219 A   3/2010
(Continued)

OTHER PUBLICATIONS

European Communication Pursuant to Rules 70(2) and 70a(2) for EP Application No. 12 83 6269.6, dated Jun. 16, 2015, (1 Sheet).
(Continued)

*Primary Examiner* — Yu Chen
(74) *Attorney, Agent, or Firm* — The Marbury Law Group PLLC

(57) ABSTRACT

A semiconductor device, such as an LED, includes a plurality of first conductivity type semiconductor nanowire cores located over a support, a continuous second conductivity type semiconductor layer extending over and around the cores, a plurality of interstitial voids located in the second conductivity type semiconductor layer and extending between the cores, and first electrode layer that contacts the second conductivity type semiconductor layer.

6 Claims, 9 Drawing Sheets

Related U.S. Application Data continuation-in-part of application No. 13/245,405, filed on Sep. 26, 2011, now Pat. No. 8,350,249.

(51) Int. Cl.

| | | |
|---|---|---|
| *H01L 33/06* | (2010.01) | |
| *H01L 29/06* | (2006.01) | |
| *H01L 33/18* | (2010.01) | |
| *H01L 29/41* | (2006.01) | |
| *H01L 33/32* | (2010.01) | |
| *H01L 33/42* | (2010.01) | |

(52) U.S. Cl.
CPC ............ *H01L 29/413* (2013.01); *H01L 33/18* (2013.01); *H01L 33/24* (2013.01); *H01L 33/32* (2013.01); *H01L 33/42* (2013.01); *H01L 33/08* (2013.01)

(56) References Cited

U.S. PATENT DOCUMENTS

| | | | |
|---|---|---|---|
| 8,785,905 B1* | 7/2014 | Wang | H01L 33/18 257/13 |
| 8,901,534 B2 | 12/2014 | Svensson | |
| 9,035,278 B2 | 5/2015 | Svensson | |
| 2004/0109666 A1 | 6/2004 | Kim, II | |
| 2005/0194598 A1 | 9/2005 | Kim et al. | |
| 2008/0012030 A1 | 1/2008 | Yone et al. | |
| 2008/0135089 A1 | 6/2008 | Tsakalakos et al. | |
| 2008/0149914 A1 | 6/2008 | Samuelson et al. | |
| 2010/0163840 A1 | 7/2010 | Seifert et al. | |
| 2011/0062453 A1 | 3/2011 | Armitage | |
| 2011/0240959 A1 | 10/2011 | Konsek et al. | |
| 2011/0254034 A1 | 10/2011 | Konsek et al. | |
| 2011/0309382 A1 | 12/2011 | Lowgren | |
| 2013/0200391 A1 | 8/2013 | Bedair et al. | |

FOREIGN PATENT DOCUMENTS

| | | |
|---|---|---|
| JP | 2007049063 A | 2/2007 |
| KR | 20060121432 A | 11/2006 |
| KR | 10-0755598 B1 | 9/2007 |
| KR | 20110103394 A | 9/2011 |
| WO | WO2010071594 A1 | 6/2010 |

OTHER PUBLICATIONS

Supplemental European Search Report pursuant to Rule 62 EPC for EP application No. 12 83 6269.6, dated May 29, 2015, (10 Sheets).
Frajtag, P. et al., "Improved Light-Emitting Diode Performance by Conformal Overgrowth of Multiple Quantum Wells and Fully Coalesced P-Type GaN on GaN Nanowires," Applied Physics Letters, vol. 98, pp. 143104-1 to 143104-3, (2011).
Neubert et al., "Investigations on Local Ga and In Incorporation of GaInN Quantum Wells on Facets of Selectively Grown GaN Stripes," Phys. Stat. Sol. (c), No. 6, May 2006, pp. 1587-1590.
Ueda et al., "Mechanisms of Metalorganic Vapor Phase Epitaxy of InGaN Quantum Wells on GaN Microfacet Structures," Phys. Stat. Sol. (c), No. 7, May 2007, pp. 2826-2829.
Funato et al., "Monolithic Polychromatic Light-Emitting Diodes Based on InGaN Microfacet Quantum Wells Toward Tailor-Made Solid-State Lighting," Applied Physics Express 1, Jan. 2008, 3pgs.
Hong et al., "Visible-Color-Tunable Light-Emitting Diodes," Advanced Materials, 2011, XX, pp. 1-5.

* cited by examiner

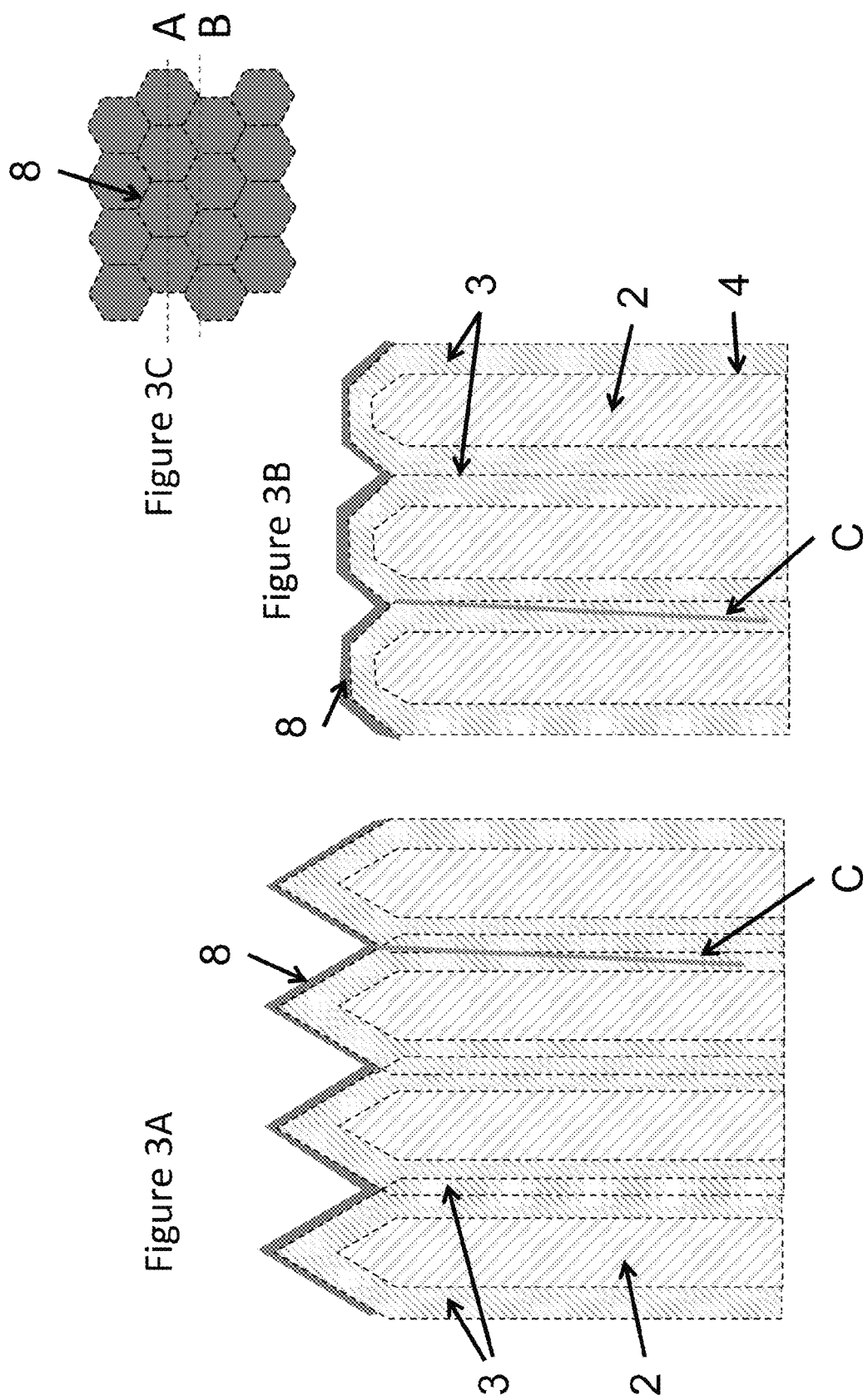

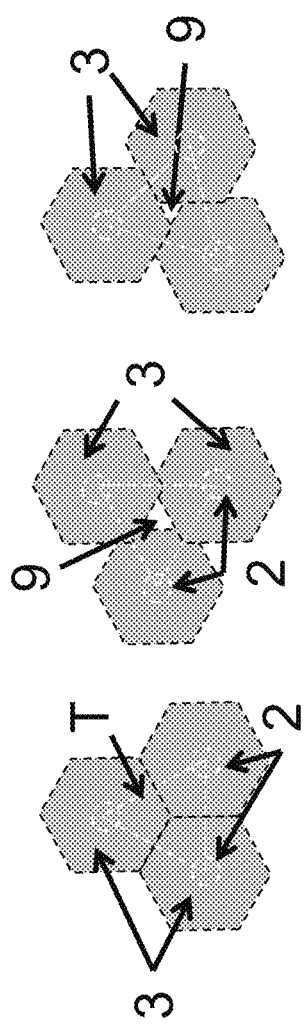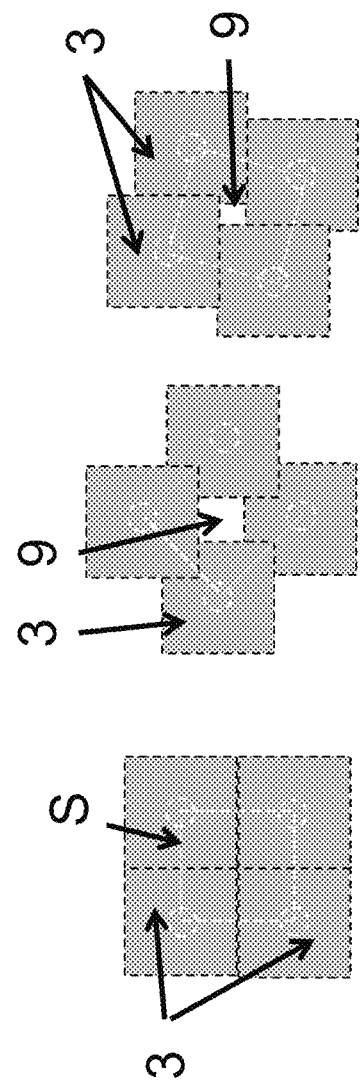
FIGURE 4C
FIGURE 4F
FIGURE 4B
FIGURE 4E
FIGURE 4A
Prior Art
FIGURE 4D
Prior Art

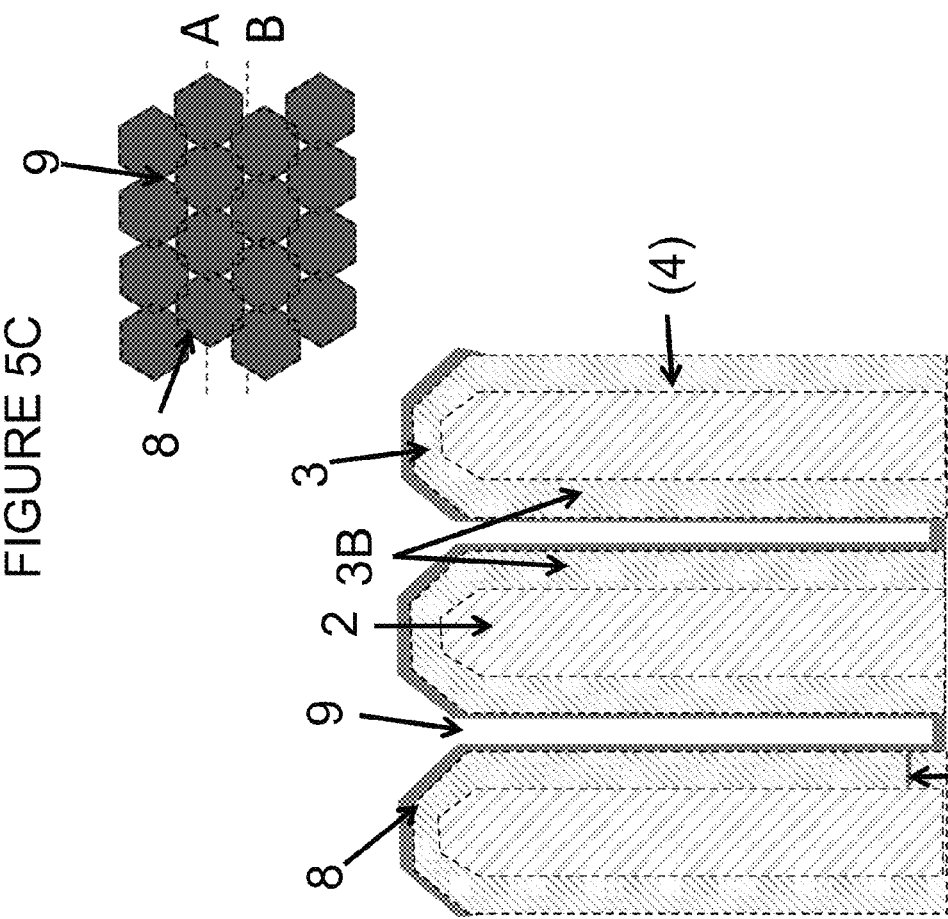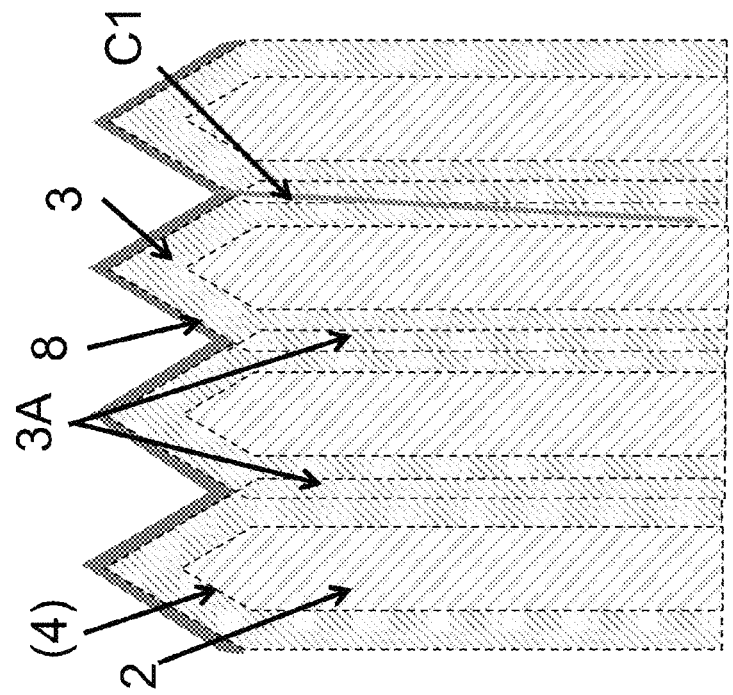

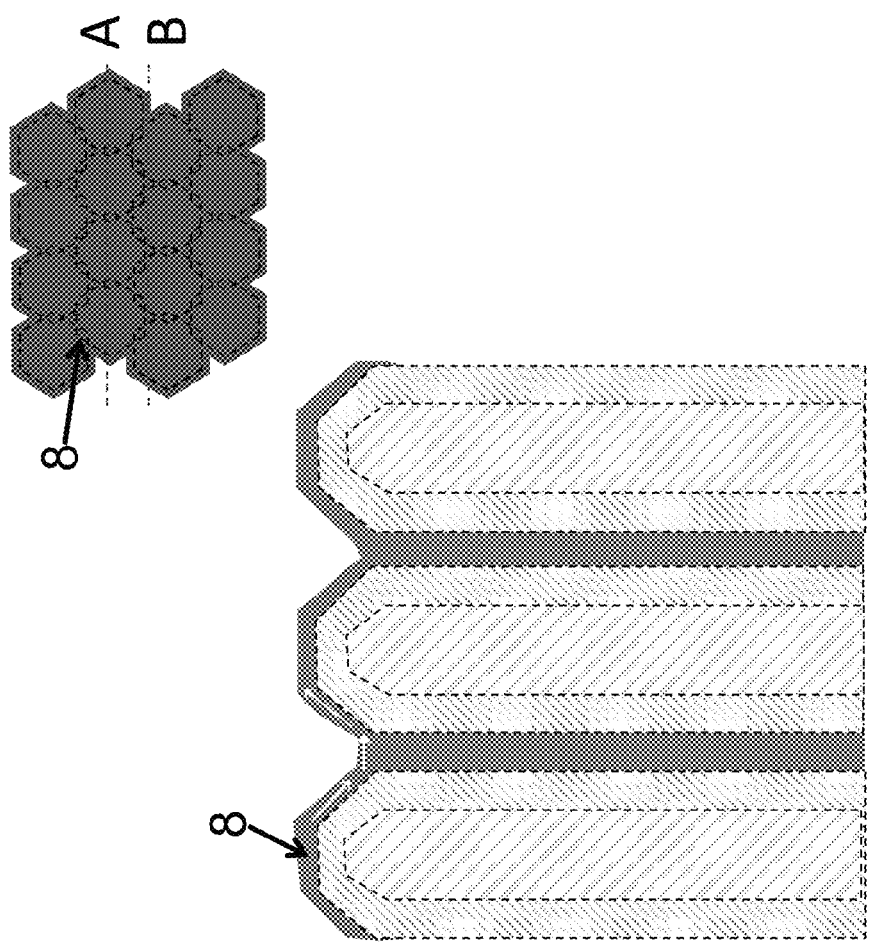
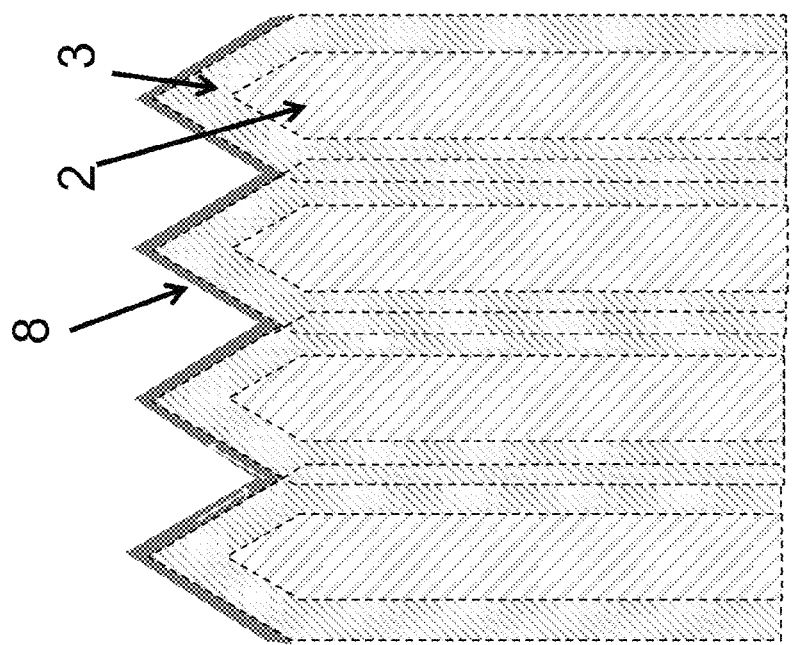
FIGURE 6A
FIGURE 6B
FIGURE 6C

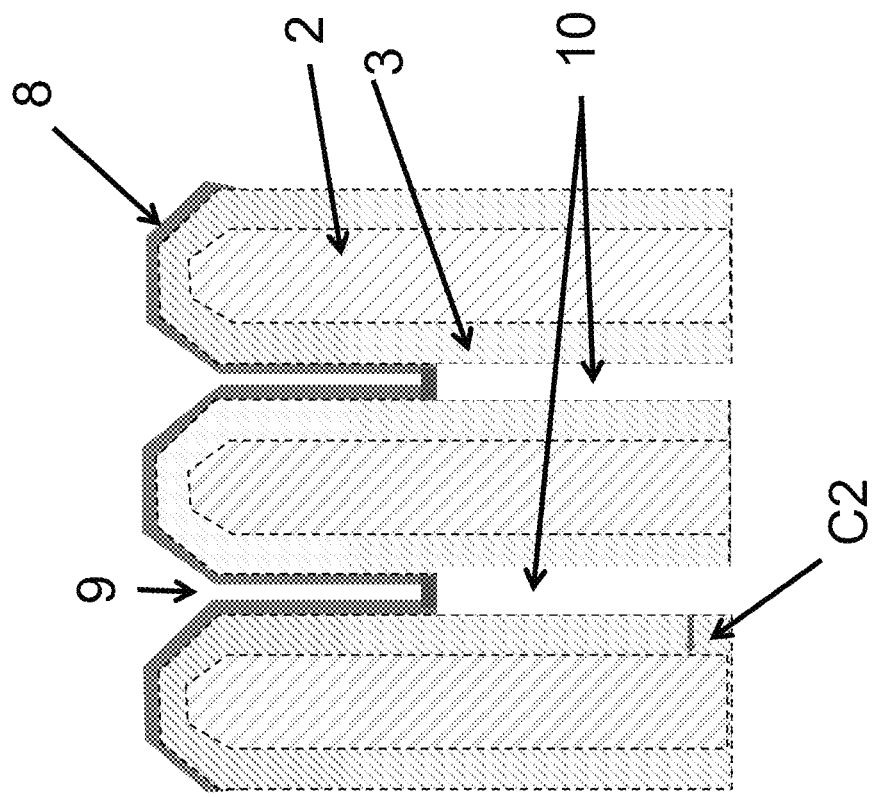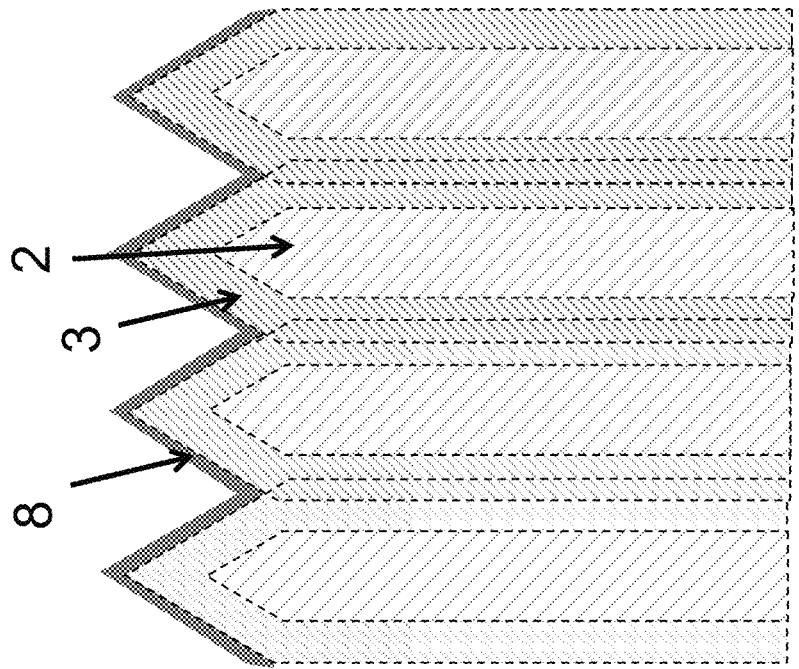

COALESCED NANOWIRE STRUCTURES WITH INTERSTITIAL VOIDS AND METHOD FOR MANUFACTURING THE SAME

TECHNICAL FIELD OF THE INVENTION

The present invention relates to nanowire based structures, in particular arrays of nanowire light emitting devices.

BACKGROUND OF THE INVENTION

Light emitting diodes (LEDs) are increasingly used for lighting, but still there are some technological challenges to overcome, in particular with regard to large-scale processing, in order to reach the real breakthrough.

Over recent years the interest in nanowire technology has increased. In comparison with LEDs produced with conventional planar technology nanowire LEDs offer unique properties due to the one-dimensional nature of the nanowires, improved flexibility in materials combinations due to less lattice matching restrictions and opportunities for processing on larger substrates. Suitable methods for growing semiconductor nanowires are known in the art and one basic process is nanowire formation on semiconductor substrates by particle-assisted growth or the so-called VLS (vapor-liquid-solid) mechanism, which is disclosed in e.g. U.S. Pat. No. 7,335,908. Particle-assisted growth can be achieved by use of chemical beam epitaxy (CBE), metalorganic chemical vapour deposition (MOCVD), metalorganic vapour phase epitaxy (MOVPE), molecular beam epitaxy (MBE), laser ablation and thermal evaporation methods. However, nanowire growth is not limited to VLS processes, for example WO 2007/102781 shows that semiconductor nanowires may be grown on semiconductor substrates without the use of a particle as a catalyst. One important breakthrough in this field was that methods for growing group III-V semiconductor nanowires, and others, on Si-substrates have been demonstrated, which is important since it provides a compatibility with existing Si processing and expensive III-V substrates can be replaced by cheaper Si substrates.

One example of a bottom emitting nanowire LED is shown in WO 2010/14032. This nanowire LED comprises an array of semiconductor nanowires grown on a buffer layer of a substrate, such as a GaN buffer layer on a Si substrate. Each nanowire comprises an n-type nanowire core enclosed in a p-type shell and a p-electrode with an active layer formed between the n-type and p-type regions that form a pn or pin junction. The buffer layer has the function of being a template for nanowire growth as well as serving as a current transport layer connecting to the n-type nanowire cores. Further the buffer layer is transparent since the light that is generated in the active area is emitted through the buffer layer.

Although nanowire LEDs have advantageous properties and performance, the processing with regard to contacting of the nanowire LEDs requires new routes as compared to planar technology. Since nanowire LEDs comprise large arrays of nanowires, thereby forming a three-dimensional surface with high aspect ratio structures, deposition of contact material using line-of-sight processes is a challenging operation.

SUMMARY

One embodiment of the invention is a semiconductor device, such as a LED, includes a plurality of first conductivity type semiconductor nanowire cores located over a support, a continuous second conductivity type semiconductor layer extending over and around the cores, a plurality of interstitial voids located in the second conductivity type semiconductor layer and extending between the cores, and first electrode layer that contacts the second conductivity type semiconductor layer and extends into the interstitial voids.

Another embodiment of the invention is a semiconductor device, such as a LED, includes a plurality of first conductivity type semiconductor nanowire cores located over a support, a first continuous layer of a second conductivity type semiconductor extending over and around the cores, a second layer of the second conductivity type semiconductor over the first layer and comprising a plurality of interstitial voids located in this second layer of second conductivity type semiconductor, and a first electrode layer that contacts the second layer of the second conductivity type semiconductor and, preferably, does not extend into the interstitial voids.

A method of making a semiconductor device comprises epitaxially growing plurality of first conductivity type semiconductor nanowire cores from portions of a semiconductor surface of a support exposed through openings in an insulating mask layer on the support, forming semiconductor active region shells on the cores, growing a continuous second conductivity type semiconductor layer extending over and around the cores and the shells, such that a plurality of interstitial voids are formed in the second conductivity type semiconductor layer extending between the cores during the step of growing, and forming a first electrode layer that contacts the second conductivity type semiconductor layer and extends into the interstitial voids.

BRIEF DESCRIPTION OF THE DRAWINGS

Preferred embodiments of the invention will now be described with reference to the accompanying drawings, wherein:

FIGS. 3A-3B schematically illustrate side cross sectional views of the prior art LED of FIG. 2 along lines A and B, respectively in FIG. 3C. FIG. 3C illustrates a top view of the prior art LED of FIG. 2.

FIGS. 4A and 4D schematically illustrate top views of prior art LEDs prior to top electrode deposition.

FIGS. 4B, 4C, 4E and 4F schematically illustrate top views of LEDs prior to top electrode deposition in accordance with alternative embodiments of the invention.

FIGS. 5A and 5B schematically illustrate side cross sectional views of the LED of FIG. 4B after top electrode deposition along lines A and B, respectively in FIG. 5C. FIG. 5C illustrates a top view of the LED of FIG. 4B after top electrode deposition.

FIGS. 6A and 6B schematically illustrate side cross sectional views of the LED of FIG. 4B after top electrode deposition along lines A and B, respectively in FIG. 6C. FIG. 6C illustrates a top view of the LED of FIG. 4B after top electrode deposition according to another embodiment of the invention.

FIGS. 7A and 7B schematically illustrate side cross sectional views of the LED of FIG. 4B after top electrode deposition along lines A and B, respectively in FIG. 5C with a partially air-bridge top electrode.

DETAILED DESCRIPTION OF EMBODIMENTS

In the art of nanotechnology, nanowires are usually interpreted as nanostructures having a lateral size (e.g., diameter for cylindrical nanowires or width for pyramidal or hexagonal nanowires) of nano-scale or nanometer dimensions, whereas its longitudinal size is unconstrained. Such nanostructures are commonly also referred to as nanowhiskers, one-dimensional nano-elements, nanorods, nanotubes, etc. Generally, nanowires with a polygonal cross section are considered to have at least two dimensions each of which are not greater than 300 nm. However, the nanowires can have a diameter or width of up to about 5 μm, for example up to 1 μm. The one dimensional nature of the nanowires provides unique physical, optical and electronic properties. These properties can for example be used to form devices utilizing quantum mechanical effects (e.g., using quantum wires) or to form heterostructures of compositionally different materials that usually cannot be combined due to large lattice mismatch. As the term nanowire implies, the one dimensional nature is often associated with an elongated shape. In other words, "one dimensional" refers to a width or diameter less than 5 microns, such as less than 1 micron, and a length greater than 5 microns, such as greater than 1 micron. Since nanowires may have various cross-sectional shapes, the diameter is intended to refer to the effective diameter. By effective diameter, it is meant the average of the major and minor axis of the cross-section of the structure.

Figure 1B:
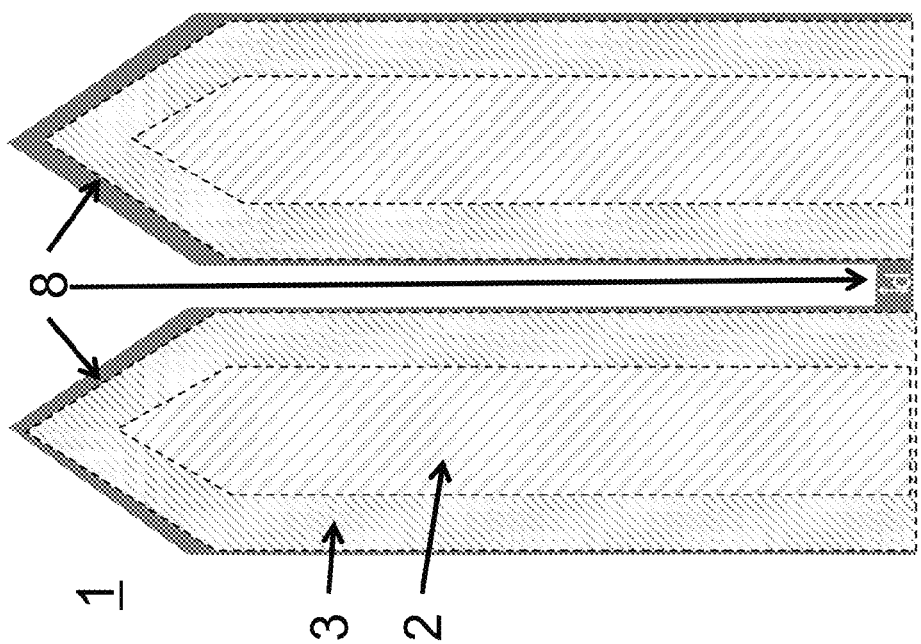
FIGS. 1A and 1B schematically illustrate respective top and side cross sectional view of a basis of a prior art nanowire LED.
Figure 1A:
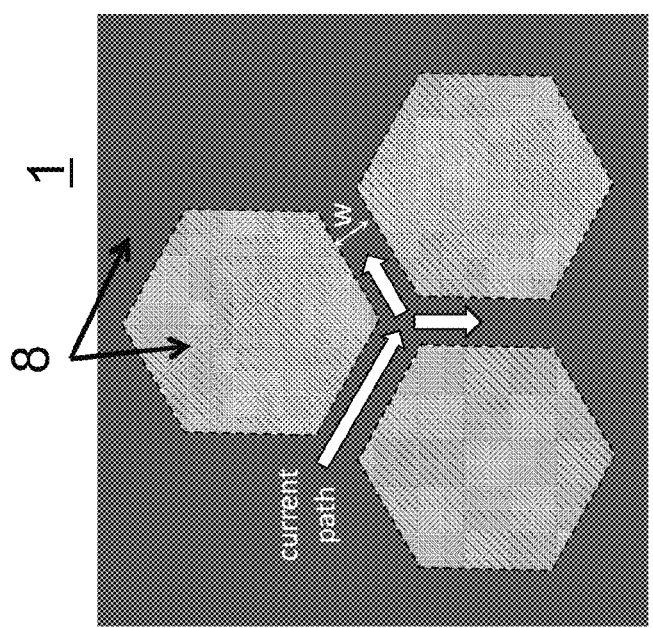

FIGS. 1A and 1B are respective top and side cross sectional views which schematically illustrate the basis for a nanowire LED structure. In principle, one single nanowire is enough for forming a nanowire LED, but due to the small size, nanowires are preferably arranged in arrays comprising thousands of nanowires (i.e., nano-devices or devices) side by side to form the LED structure. The individual nanowire LED devices are made up from nanowires 1 having an n-type nanowire core 2 and a discreet p-type shell volume element 3 at least partly enclosing the nanowire core 2 and an intermediate active region 4 (shown in FIG. 1C) comprising a semiconductor active layer or one or more quantum wells. This forms a light emitting p-i-n junction when the volume element 3 directly physically contacts the intrinsic active region 4 or a light emitting p-n junction if the active region 4 is doped p or n type. However, the nanowire LED devices are not limited to this configuration. For example the nanowire core 2, the active region 4 and the p-type shell volume element 3 may be made up from a multitude of layers or segments. As described above, in alternative embodiments, only the core 2 and the volume element 3 may form a light emitting p-n junction when the volume element 3 directly physically contacts the core 2. The active region 4 may be omitted in this case. In order to function as a LED, the n-side and p-side of each nanowire 1 has to be contacted. Thus, as used herein, the core may comprise any suitable nano element having a width or diameter of less than 5 microns, such as less than 1 micron, and a length greater than 5 microns, such as greater than 1 micron and may comprise a single structure or a multi-component structure. For example, the core may comprise a semiconductor nanowire of one conductivity type or it may comprise the semiconductor nanowire of one conductivity type surrounded by one or more semiconductor shells of the same conductivity type and the core having a pillar or pyramid shape. For simplicity, a single component nanowire pillar core will be described below and illustrated in the figures below.

Figure 1C:
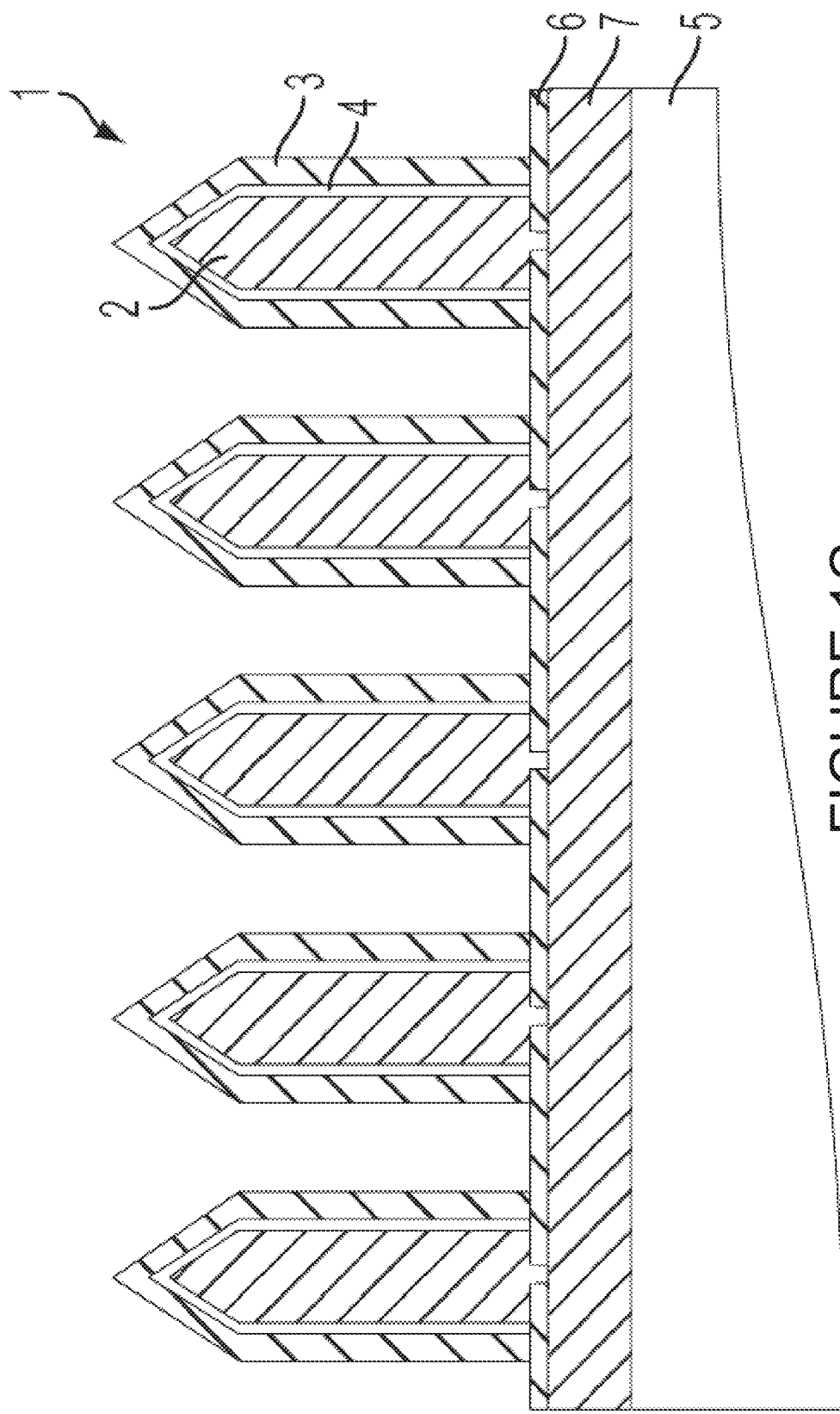
FIG. 1C schematically illustrates a side cross sectional view of a prior art nanowire LED structure.

As shown in FIG. 1C, by growing the nanowires 1 on a growth substrate 5, optionally using a growth mask 6 (e.g., a nitride layer, such as silicon nitride dielectric masking layer) to define the position and determine the bottom interface area of the nanowires 1, the substrate 5 functions as a carrier for the nanowires 1 that protrude from the substrate 5, at least during processing. The bottom interface area of the nanowires comprises the area of the core 2 inside each opening in the masking layer 6. The substrate 5 may comprise different materials such as III-V or II-VI semiconductors, Si, Ge, Al$_2$O$_3$ (e.g., sapphire), SiC, Quartz, glass, etc., as discussed in Swedish patent application SE 1050700-2 (assigned to GLO AB), which is incorporated by reference herein in its entirety. In one embodiment, the nanowires 1 are grown directly on the growth substrate 5.

Figure 2:
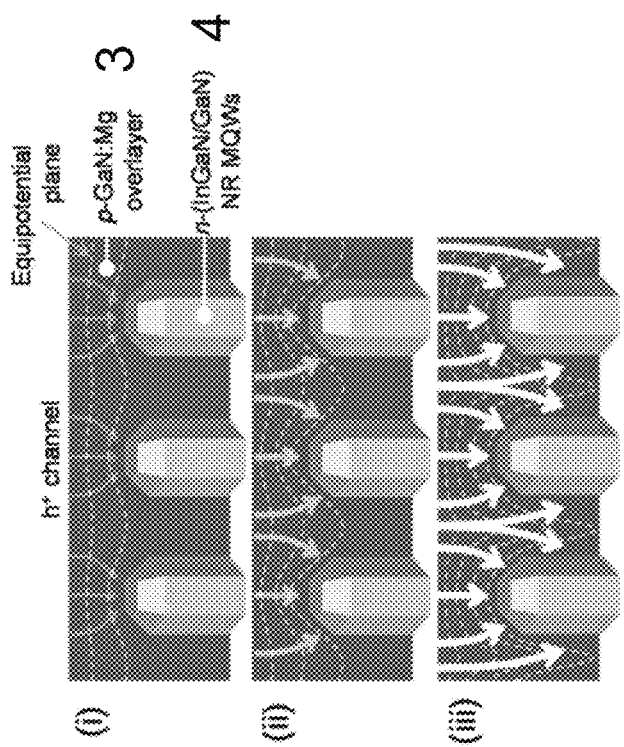
FIG. 2 schematically illustrates a side cross sectional view of another prior art nanowire LED structure.

Preferably, the substrate 5 is also adapted to function as a current transport layer connecting to the n-side of each nanowire 1. This can be accomplished by having a substrate 5 that comprises a buffer layer 7 arranged on the surface of the substrate 5 facing the nanowires 1, as shown in FIG. 2. The buffer layer may be a III-nitride layer, such as a GaN and/or AlGaN buffer layer 7 on a Si substrate 5. The buffer layer 7 is usually type matched to the desired nanowire material, and thus functions as a growth template in the fabrication process. For an n-type core 2, the buffer layer 7 is preferably also doped n-type. The buffer layer 7 may comprise a single layer (e.g., GaN), several sublayers (e.g., GaN and AlGaN) or a graded layer which is graded from high Al content AlGaN to a lower Al content AlGaN or GaN. The nanowires can comprise any semiconductor material, but for nanowire LEDs III-V semiconductors such as a III-nitride semiconductor (e.g., GaN, AlInGaN, AlGaN and InGaN, etc.) or other semiconductors (e.g., InP, GaAs) are usually preferred. It should be noted that the nanowire 1 may comprise several different materials (e.g., GaN core, InGaN active layer or quantum well(s) and InGaN shell having a different In to Ga ratio than the active region). In general the substrate 5 and/or the buffer layer 7 are referred to herein as a support or a support layer for the nanowires. Alternatively, a conductive layer (e.g., a mirror or transparent contact) may be used as a support instead of or in addition to the substrate 5 and/or the buffer layer 7. Thus, the term "support layer" or "support" may include any one or more of these elements.

Although the fabrication method described herein preferably utilizes nanowire cores 2 grown on exposed buffer layer 7 portions in openings in the masking layer 6, as described for example in U.S. Pat. No. 7,829,443, to Seifert et al., incorporated herein by reference for the teaching of nanowire fabrication methods, it should be noted that the invention is not so limited. Nanowire cores 2 grown using VLS methods with catalyst seed particles or using other methods may be used instead.

In prior art nanowire LEDs 1 shown in FIGS. 1A-1C, the contacting of the p-side 3 of each nanowire 1 is typically accomplished by depositing a p-electrode 8 comprising a conductive layer that encloses the p-type shell 3 of each nanowire 1 and extends to the insulating layer 6 on the substrate 5 or buffer layer 7. The conductive layer of p-electrode 8 extends on this insulating layer 6 to adjacent nanowires 1. However, since the nanowires of a nanowire LED are closely spaced (with the spacing between the nanowires 1 shown by line W in FIG. 1A) and being of high aspect ratio, in order to obtain a high luminescence, the p-electrode deposition is a challenging operation. Typically line-of-sight processes, such as sputtering or evaporation are used for electrode deposition. Due to the line-of-side deposition, a preferential growth on the tips of the nanowires and a shadowing effect are observed that result in a tapering of the p-electrode 8 with decreased thickness towards the base of the nanowires 1, as shown in FIG. 1B. Hence, in order to obtain efficient lateral current spreading, the thickness of the p-electrode 8 will become unnecessarily thick on the tips of the nanowires while being insufficiently thick in between the nanowires. The shadowing effect may also be so severe that there are discontinuities in the p-electrode. Thus, the p-electrode 8 thickness on the nanowire 1 side walls and the bottom surface (e.g., on layer 6) will be very dependent on the length of the nanowires as well as the distance between them. The p-electrode 8 portion on the bottom part of the surface of layer 6 will be the electric path and will be a grid with width depending on the distance between the nanowires, as shown by arrows in FIG. 1A. The current spreading in such a contact layer can be very poor if contacts are too thin in thickness or width, as shown in FIG. 1B.

To overcome the poor current spreading, a planarization of the structures by growing a continuous p-layer 3 so that the nanowire volume elements coalesce into a continuous layer can be performed. This will create a planar like surface where conventional contacts easily can be deployed. The continuous p-layer 3 may be grown by the same method (e.g., MOCVD) as the discrete p-shells described in the U.S. Pat. No. 7,829,443, except that the growth time is increased to form a continuous layer instead of discreet shells. By forming a continuous, substantially planar volume element 3 (whose upper surface may not be exactly planar due to curvature of the underlying nanowire and interstitial nanowire space topography), the contact is moved from being on the sidewalls of shell volume elements to being only on the top of the continuous volume element, as shown in FIG. 2, which is reproduced from an article by "Visible-Color-Tunable Light-Emitting Diodes," by Young Joon Hong et. al. in the Jun. 3, 2011 on line edition of Advanced Materials. However, this configuration caused relatively high series resistance due to longer conduction path through thick, resistive p-GaN volume element and lighting up different part of structure due to the thick poorly conductive p-GaN material.

FIG. 3C illustrates the schematic top view of the coalesced p-volume element on nanowire cores layout of Hong et al. FIGS. 3A and 3B are schematic side cross sectional views along lines A and B in FIG. 3C along the nanowire peaks and sides, respectively. As shown in FIG. 3C, the nanowire cores 2 and active region 4 have a hexagonal cross sectional shape when viewed from the top. The devices 1 with the continuous volume element 3 form a tessellation or tiling of the plane shown in FIG. 3C. This means that the continuous p-type layer or volume element 3 fills in all of the space between the nanowire cores 2 and active regions 4 without any overlaps or gaps. Specifically, the hexagonal devices 1 form a regular tessellation of congruent regular hexagons or a "honeycomb tile" where three hexagons come together at each vertex. In other words, each vertex or "corner" of a hexagon contacts corners of two other hexagons in the tessellation. As shown in FIGS. 3A and 3B, the current path from the p-electrode 8 to the bottom of the device is shown by line C which extends through most of the volume element 3 height along the height of the device. This configuration causes relatively high series resistance due to longer conduction path C through the thick, resistive p-GaN volume element 3.

The present inventor realized that there is a way to get a coalesced, connected, substantially planar p-GaN layer or volume element 3 and enable a shorter conduction path down to the sidewalls of the nanowires 1, to reduce the high series resistance of the devices shown in FIGS. 2 and 3. Specifically, the continuous p-GaN layer or volume element 3 is grown such that it contacts plural active regions 4 on plural respective nanowires cores 2 and such that the volume element 3 contains openings or interstitial voids between the active regions 4 on respective nanowire cores 2. The p-type electrode 8 is located on the continuous, substantially planar p-type layer 3 for a lower contact resistance and the p-type electrode 8 also extends down into the interstitial voids to provide a shorter conduction path and lower series resistance.

The interstitial voids may be formed using any suitable method. For example, the voids may be formed based on how the cores 2 are placed with respect to each other, which is determined by the lattice geometry in the buffer layer 7 or substrate 5 exposed in openings in the insulating layer 6. For example, as shown in FIG. 4A, growing the nanowire cores 2 on a (0001) n-GaN buffer layer 7 or on a (111) n-Si substrate 5 generates cores 2 with a hexagonal cross-sectional shape when viewed from the top. The hexagonal cross sectional shape is preferably substantially regular hexagonal, i.e., each internal angle of the hexagon is about 120 degrees (plus or minus 0-10 degrees due to possible growth irregularities).

When the hexagonal cores 2 are positioned in units cells of three cores at vertices of an imaginary equilateral triangle "T" with vertices of each core pointing at two other vertices of adjacent cores, then the tessellated honeycomb structure with no interstitial voids results after the active regions 4 and the volume element 3 are formed over the cores 2, as shown in FIG. 4A. In contrast, when the cores are with respect to each other such that one points to less than two other vertices of adjacent cores, then interstitial voids 9 are formed after the active regions 4 and the volume element 3 are formed over the cores 2, as shown in FIGS. 4B and 4C.

For example, as shown in FIG. 4B, when the cores 2 are rotated by about 30 degrees with respect to the cores 2 shown in FIG. 4A such that each vertex of a hexagon points at one but not two vertices of one adjacent hexagon, then large triangular interstitial voids 9 are formed in the continuous volume element 3 after the active regions 4 and the volume element 3 are formed over the cores 2. In another example, as shown in FIG. 4C, when the cores 2 are rotated by less than 90 degrees but more than 60 degrees such that each vertex of a hexagon points at no vertices of an adjacent hexagon, then small triangular interstitial voids 9 are formed in the continuous volume element 3 after the active regions 4 and the volume element 3 are formed over the cores 2.

Hexagonal III-nitride based nanowires (e.g., GaN nanowires) always grow in the same facet direction based on the crystal orientation of the underlying material, such as Si (111) or GaN (0001). Thus, specific facets of the hexagonal cores 2 will always be oriented at the same angle with respect to the wafer flat of the underlying Si (001) substrate or GaN (0001) buffer layer. Rotating the triangle T in FIGS. 4B and 4C with regard to the triangle T in FIG. 4A causes the nanowire core 2 facets to be rotated in FIGS. 4B and 4C with regard nanowire core 2 facets in FIG. 4A. A rotation of the facets of the cores causes the volume element 3 to be either coalesced when the facets form a honeycomb pattern in FIG. 4A or to have voids 9 when the facets do not form the honeycomb pattern in FIGS. 4B and 4C. In other words, a line normal to each vertex of a hexagonal core 2 intersects at a point two lines normal to two closest respective vertices of two adjacent cores 2 to form the honeycomb pattern in FIG. 4A. In contrast, a line normal to each vertex of a hexagonal core 2 does not intersect at a point two lines normal to two closest respective vertices of two adjacent cores 2 to not form the honeycomb pattern in FIGS. 4B and 4C. Thus, depending on the orientation of the triangle T with regard to the crystal orientation of the underlying material, the volume element will be either coalesced as shown in FIG. 4A or contain voids 9 as shown in FIG. 4B or 4C.

In an alternative embodiment, the voids 9 can also be formed using post volume element 3 growth processing. In this embodiment, a mask (e.g., a photoresist and/or hard mask) containing openings formed by lithography, such as photolithography, e-beam lithography, nano-imprint lithography, etc. is formed over the coalesced volume element 3. The portions of the volume element 3 exposed in the mask openings are then etched using anisotropic etching to form deep holes (e.g., voids 9) in the volume element. The etching of the volume element 3 may be done on a volume element which is deposited such that it contains no voids 9 (e.g., as shown in FIG. 4A). Alternatively, the etching may be done on a volume element 3 which is deposited with narrow voids 9 (e.g., as shown in FIG. 4C) to widen the width of the voids 9. In this case, the openings in the mask are aligned with the voids 9 before etching. The mask (e.g., photoresist) is preferably removed after the etching step.

Alternatively, the cores 2 may have a square cross sectional shape (when viewed from the top) as shown in FIG. 4D, by growing the cores on substrates with other crystal orientations. The active regions four (e.g., layers or quantum well(s)) will have substantially the same cross sectional shape (when viewed from the top) as the underlying cores 2. When the square cores 2 are positioned in units cells of four cores at vertices of an imaginary square "S" with vertices of each core pointing at three other vertices of three adjacent cores, then the tessellated square structure with no interstitial voids results after the active regions 4 and the volume element 3 are formed over the cores 2, as shown in FIG. 4D. In contrast, when the cores are turned with respect to each other such that each vertex points at less than 3 adjacent vertices (including pointing at not adjacent vertices), then interstitial voids 9 are formed after the active regions 4 and the volume element 3 are formed over the cores 2, as shown in FIGS. 4E and 4F.

For example, as shown in FIG. 4E, when the cores 2 are rotated by about 45 degrees such that each vertex of a square points at one vertex of one adjacent square, then large square interstitial voids 9 are formed in the continuous volume element 3 after the active regions 4 and the volume element 3 are formed over the cores 2. In another example, as shown in FIG. 4F, when the cores 2 are rotated such that each vertex of a square points at no vertices of an adjacent square, then small rectangular interstitial voids 9 are formed in the continuous volume element 3 after the active regions 4 and the volume element 3 are formed over the cores 2.

FIG. 5C illustrates the schematic top view of the coalesced p-volume element on nanowire cores of FIG. 4B after the p-electrode 8 is formed over the volume element 3. FIGS. 5A and 5B are schematic side cross sectional views along lines A and B in FIG. 5C along the nanowire peaks and sides, respectively. As shown in FIG. 5C, the nanowire cores 2 and active region 4 have a hexagonal cross sectional shape when viewed from the top. The devices 1 with the continuous volume element 3 form a non-tessellated or non-tiled configuration of the plane shown in FIG. 5C. This means that the continuous p-type layer or volume element 3 does not fill in all of the space between the nanowire cores 2 and active regions 4, and the triangular interstitial voids 9 toward the insulating masking layer 6 are formed.

Specifically, the hexagonal devices 1 do not form a regular tessellation of congruent regular hexagons or a "honeycomb tile" where three hexagons come together at each vertex. In other words, each vertex or "corner" of a hexagon does not contact corners of two other hexagons in the tessellation. As shown in FIG. 5A, the volume element 3 fills the entire space between the cores 2/active regions 4 to layer 6 when viewed in cross section along the peaks of the hexagonal cores 2 along line A. Thus, the volume element (i.e., p-GaN layer) 3 is continuous between plural cores 2/active regions 4.

However, as shown in FIG. 5B, the volume element 3 does not fill the entire space between the cores 2/active regions 4 when viewed in cross section along line B located between the peak and edge of the cores 2. This forms the interstitial voids 9 to layer 6 along line B in the volume element 3. The interstitial voids 9 are partially filled with the p-electrode 8. This provides a shorter current path C2 between the p-electrode 8 and core 2 along line B than current path C1 between the p-electrode 8 and core 2 along line A in FIG. 5A.

Thus, the p-GaN layer 3 has a first portion 3A shown in FIG. 5A which fills interstitial spaces between the cores 2. The p-GaN layer also has a second portion 3B shown in FIG. 5B which forms sidewalls of the interstitial voids 9. The p-electrode 8 contacts the top of the p-GaN layer 3 (but not the first portion 3A which is not exposed) in FIG. 5A and contacts the second portion 3B of the p-GaN layer 3 in the voids 9.

Having contacts on the sidewalls of the volume element 3 along some cross sectional lines but not others in the array will reduce the resistive conduction path through the poorly conducting p-GaN volume element 3 and will enable the device for more uniform carrier injection to the active region 4 present on the sidewalls of cores and reduced series resistance, which provide better LED performance. The p-electrode 8 will contact all six sidewalls of each volume element 3 on each core 2/active region 4 because there are six voids 9 adjacent to each hexagon (one void per hexagon side) as shown in FIG. 5C.

In an alternative embodiment, the p-electrode 8 fills each entire interstitial void 9. FIGS. 6A-6C are identical to FIGS. 5A-5C, except that the p-electrode 8 fills the entire interstitial voids 9, as shown in FIG. 6B. The current spreading in the electrode 8 is shown by arrows in FIG. 6B. This forms a fully connected planar p-electrode 8 on top of the device. By depositing a thick enough electrode 8, the voids 9 are fully filled to form a fully connected planar contact or electrode layer 8 for improved current spreading. This electrode 8 layer which completely fills the voids 9 as shown in FIG. 6B may be deposited by a non-directional deposition method (e.g., ZnO deposited by atomic layer deposition), while the electrode 8 layer which does not completely fill the voids 9 as shown in FIG. 5B may be deposited by a directional deposition method (e.g., ITO or Ag deposited by sputtering). If desired, the electrode 8 may be deposited by a combination of non-directional and directional deposition methods (e.g., such that the electrode 8 contains a first sublayer deposited by a directional deposition method and a second sublayer deposited by a non-directional deposition method).

In another embodiment, the electrode 8 may be formed in an air-bridged configuration in the voids 9 as shown in FIGS. 7A and 7B. As used herein, the term "air-bridged electrode" is taken to mean an electrode structure that extends between adjacent individual devices to leave an empty space between the adjacent devices. The empty space is preferably surrounded by the adjacent devices (e.g., by the continuous volume element 3 contacting plural active regions 4) on the sides, the air-bridged electrode 8 on the "top" and the support of the devices on the "bottom", where the terms top and bottom are relative depending on which way the device is positioned. The air-bridged electrode covers the volume element 3 tips and the voids 9, such that there is an empty space 10 beneath the electrode 8 between the nanowire support layer (e.g., substrate 5, buffer layer 7, insulating mask layer 6, etc.) and the electrode 8. The air bridged electrode may be formed by providing a sacrificial material that fill the bottom of the voids 9, forming the electrode 8 in the top portions of the voids 9 and then removing the sacrificial material to leave the empty spaces 10 at the bottom of the voids 9, as taught in U.S. application Ser. No. 13/163,280 filed on Jun. 17, 2011 and incorporated herein by reference in its entirety.

The voids 9 between the individual devices can not only give an access to improved electrical contact but also provide photonic crystal effects for enhanced light extraction. The photonic crystal configurations include but are not limited to two dimensional hexagonal, triangular, honeycomb or square type that gives a bandgap for or reduces lateral emission. The photonic crystal lattice constant can be given by ½ of the spacing of the nanowire cores 2. The band gap corresponding wavelength is usually lower than or on the order of the lattice spacing, which is advantageous in visible light regimes.

While FIGS. 5A-5C and 6A-6C illustrate the formation of the electrode 8 in the structure of FIG. 4B, it should be understood that similar structures will be formed by the formation of electrode 8 in the structures of FIGS. 4C, 4E and 4F. While the first conductivity type of the core is described herein as an n-type semiconductor core and the second conductivity type volume element is described herein as a p-type semiconductor layer, it should be understood that their conductivity types may be reversed. The p-type semiconductor layer 3 may comprise semiconductor materials other than p-GaN, such as p-type InGaN, AlGaN, AlInGaN, etc.

In another aspect of the invention, the devices are suitable to overcome poor current spreading and to increase light extraction efficiency, by a planarization of the structures by growing a continuous p-type layer so that the top surface of the nanowire volume elements coalesce into a continuous layer, this continuous layer is formed while simultaneously including voids or holes in the continuous layer that interpose the nanowire volume elements. This creates a planar like surface where conventional contacts can be deposited and at the same time will create light-scattering variations in index of refraction within the semiconductor device, thereby increasing the amount of light which is extracted from the semiconductor device. As used herein, a planar like surface has a height variation between over two nanowires in the active LED region the lowest and highest points of 50% or less, such as 0-25%, such as 5-10%. The continuous p-type layer comprising voids may be formed by suitable methods (e.g. MOCVD) as the nanowire volume elements.

In one embodiment, multiple p-type layers are formed around the n-type cores, at least one of the p-type layers is coalesced, and in this coalesced layer, the voids are formed. The electrode layer is then formed on the top of the coalesced p-type layer and the electrode, preferably, does not enter into the voids.

Figure 8A:
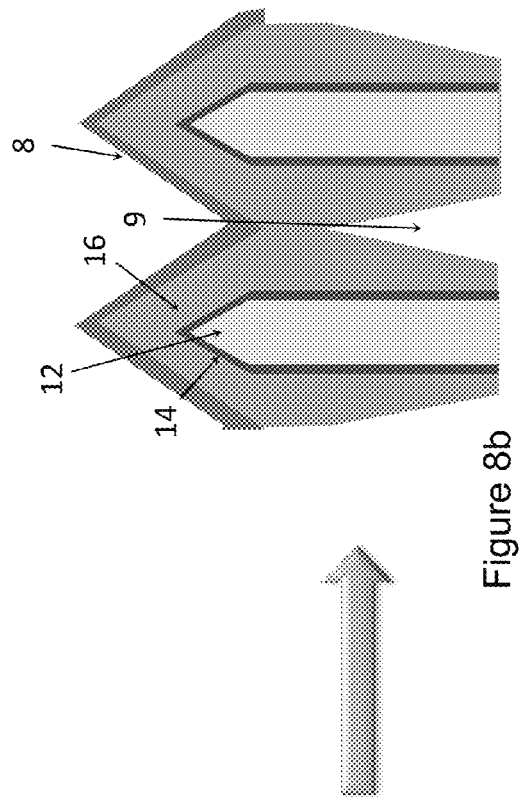
FIGS. 8A and 8B schematically illustrate side cross sectional views of an LED with interstitial voids.
Figure 8B:
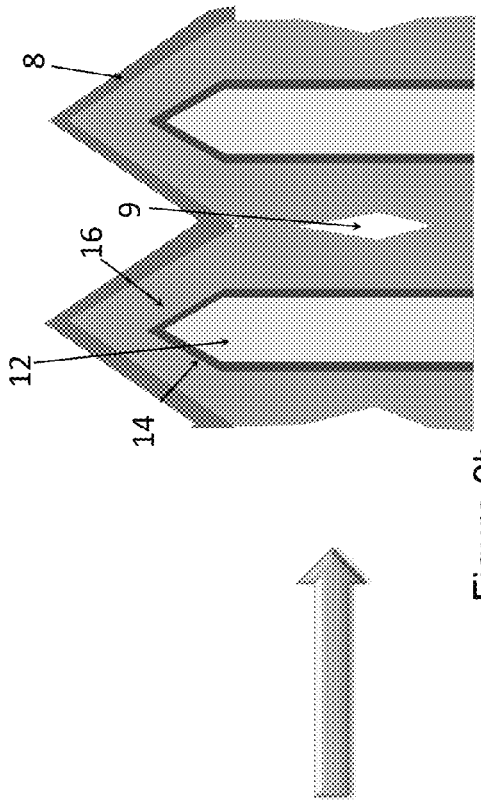

FIGS. 8 and 9 illustrate two schematic cross-sections of embodiments of nanowire semiconductor devices comprising voids which interpose the nanowire volume elements. In FIG. 8, the process conditions used to form the second layer of the second conductivity semiconductor are selected such that the growth rate of semiconductor material is highest near the end of the nanowire farthest from the support. In FIG. 8a, a cross-section of two nanowires is illustrated part-way into the time of the deposition process of the second layer of the second conductivity type semiconductor. In this embodiment, as depicted in FIG. 8a, the device comprises the nanowire core and active region 12, a first continuous layer of second conductivity type semiconductor 14, and the second layer of second conductivity type semiconductor 16. In FIG. 8b, a cross-section of two nanowires is illustrated later in fabrication process after the deposition process has provided enough material such that the top surface of the semiconductor device (e.g., top of layer 16) is continuous and a plurality of voids 9 interposes the nanowire volume elements.

Figure 9A:
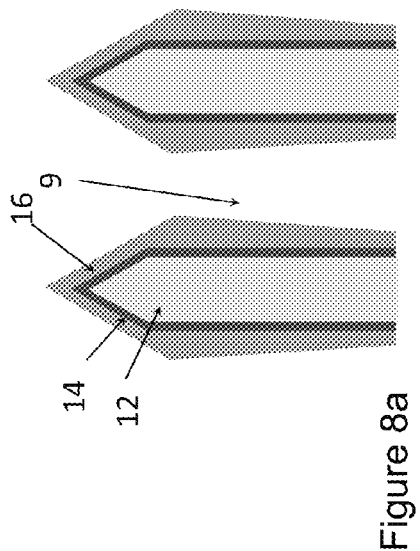
FIGS. 9A and 9B schematically illustrate side cross sectional views of an LED with interstitial voids.
Figure 9B:
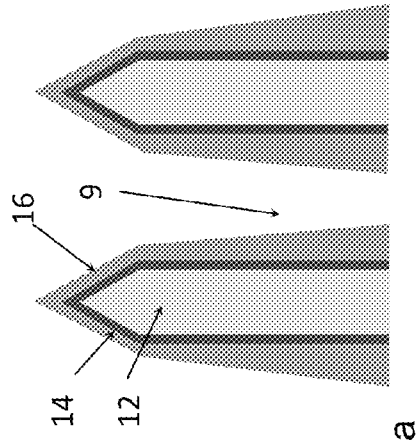

In another embodiment depicted in FIG. 9, the process conditions are selected such that the growth rate of the second conductivity type semiconductor material is higher at the ends of the nanowire farthest from and closest to the support than near the mid-length of the nanowire. In FIG. 9a, a cross-section of two nanowires is illustrated part-way into the time of the deposition process of the second conductivity layer. In this embodiment, as depicted in FIG. 9b, the device comprises the nanowire core and active region 12, the first continuous layer of second conductivity type semiconductor 14, and the second layer of second conductivity type semiconductor 16. In FIG. 9b, a cross-section of two nanowires is illustrated later in the fabrication process after the deposition process has provided enough material such that the top surface of the semiconductor device (e.g., top of layer 16) is continuous and a plurality of voids 9 interposes the nanowire volume elements.

As shown in FIGS. 8b and 9b, the epitaxial growth of the second continuous layer of the second conductivity type 16 completely encloses the interstitial voids 9, such that the voids 9 are completely enclosed by layer 16 on top and sides. In FIG. 8b, the voids 9 extend to the underlying layer (e.g., the mask layer 6 or another layer) on the bottom of the voids 9. Thus, in FIG. 8b, the voids 9 are enclosed on the bottom by this underlying layer. In contrast, in FIG. 9b, the voids 9 are completely enclosed by layer 16 on top, bottom and the sides. Thus, as shown in FIGS. 8b and 9b, when the electrode layer 8 is deposited over the p-type semiconductor layer 16, the electrode layer 8 does not extend into the completely enclosed interstitial voids 9.

In a preferred embodiment, the nanowire core 12 comprises n-type GaN, the continuous layer of second conductivity type semiconductor 14 comprises p-type AlGaN, and the second layer of second conductivity type semiconductor 16 (i.e., the layer with the voids 9) comprises p-type GaN.

In one embodiment, the method for forming the devices shown in FIGS. 8 and 9 comprises forming the second layer of a second conductivity type 16 in preferred conditions when using MOCVD as the growth method and the semiconductor material is GaN. In the prior art, wherein no voids or holes interpose the nanowire volume elements, the layer of a second conductivity type semiconductor is typically formed at a temperature of 900° C. or higher in an ambient gas comprising $H_2$. In this embodiment of the present invention, the second layer of a second conductivity type comprising voids or holes is preferably formed at a lower temperature of 900° C. or lower in an ambient gas comprising $H_2$, or $H_2$ and $N_2$, or $N_2$. For other semiconductor materials, for example InGaN, or AlGaN, the voids may be formed by other suitable growth conditions. In yet another embodiment, layer 16 is a doped semiconductor layer and dopants in the second layer (such as Mg, in the case of GaN) may be used to form the voids or holes.

The nanowire LED structure of the embodiments of the present invention is either adapted for top emitting, i.e., light emission through the p-electrode, or bottom emitting, i.e., light emission through the support layer (i.e., through the conductive layer and/or buffer layer and/or substrate). The electrode contacts may be formed as described in U.S. application Ser. No. 13/163,280 filed on Jun. 17, 2011 and incorporated herein by reference in its entirety. As used herein, the term light emission includes visible light (e.g., blue or violet light) as well as UV or IR radiation.

For a top emitting device, the p-electrode 8 needs to be transparent (i.e., it should transmit the majority of light emitted by the LED). Indium Tin Oxide (ITO) is a suitable material for the p-electrode, in particular for the top emitting nanowire LED. The ITO preferably has a thickness of 150-900 nm, more preferably 250-650 nm, most preferably about 500 nm. Other suitable materials for a p-electrode on a top emitting device are ZnO, doped ZnO and other transparent conducting oxides (TCOs). Important parameters for this material are good transparency, electrical conductivity and the ability to make low resistive contact to the volume element. High thermal conductivity is also desirable, together with a matching refractive index (depending on configuration). In one embodiment of a top emitting nanostructured LED the substrate is provided with a reflecting means (e.g., mirror) that preferably extends in a plane under the nanowire LEDs. The n-electrode may be formed on the bottom of the n-Si substrate 5 shown in FIG. 1C.

For a bottom emitting LED, the p-electrode 8 is preferably reflective and comprises Ag, Al, etc. The p-electrode may comprise one or more additional layers deposited on the p-electrode for improving the reflective and/or conductive properties (e.g., electrode 8 may include a transparent metal oxide, such as ZnO or ITO with an overlying reflective mirror layer, such as an Ag layer). A separate n-electrode layer, such as Ti and/or Al is formed in contact with the n-substrate 5 or n-buffer layer 7 depending on the orientation of the LED device. An added advantage of this configuration is a decrease in absorption that pillars of electrodes incur as compared with side wall contacts.

Although the present invention is described in terms of contacting of nanowire LEDs, it should be appreciated that other nanowire based semiconductor devices, such as field-effect transistors, diodes and, in particular, devices involving light absorption or light generation, such as, photodetectors, solar cells, lasers, etc., can be contacted in the same way, and in particular the air-bridge arrangement can be implemented on any nanowire structures.

All references to top, bottom, base, lateral, etc are introduced for the easy of understanding only, and should not be considered as limiting to specific orientation. Furthermore, the dimensions of the structures in the drawings are not necessarily to scale.

While the invention has been described in connection with what is presently considered to be the most practical and preferred embodiments, it is to be understood that the invention is not to be limited to the disclosed embodiments, on the contrary, it is intended to cover various modifications and equivalent arrangements within the scope of the appended claims.

The invention claimed is:

1. A semiconductor device, comprising:
   a plurality of first conductivity type semiconductor nanowire cores located over a support;
   an active region shell surrounding each nanowire core;
   a first continuous layer of a second conductivity type semiconductor extending over and surrounding the cores;
   a second continuous layer of the second conductivity type semiconductor extending over and surrounding the cores;
   a plurality of interstitial voids located within the second continuous layer of the second conductivity type semiconductor and extending between the cores; and
   a first electrode layer that contacts the second continuous layer of the second conductivity type semiconductor;
   wherein:
   the device comprises a light emitting diode (LED) device;
   the active region shell comprises at least one quantum well and the first continuous layer of second conductivity type semiconductor contacts the at least one quantum well to form a light emitting p-n junction at each nanowire core surrounded by the at least one quantum well shell;
   the second continuous layer of the second conductivity type semiconductor extends over and surrounds the first continuous layer of second conductivity type semiconductor and the second continuous layer of second conductivity type semiconductor comprising the plurality of interstitial voids interposing the cores, wherein the interstitial voids are completely enclosed on top and sides by the second continuous layer of the second conductivity type;
   the first electrode layer that contacts the second continuous layer of the second conductivity semiconductor does not extend into the interstitial voids;
   the first conductivity type comprises n-type, the second conductivity type comprises p-type and the first electrode layer comprises a p-electrode layer;
   the support comprises an n-type semiconductor buffer layer on a substrate;
   the substrate comprises an n-Si or sapphire substrate, the buffer layer comprises an n-GaN or n-AlGaN layer, the cores comprise n-GaN nanowires epitaxially extending from portions of the buffer layer surface exposed through openings in an insulating mask layer on the buffer layer, the at least one quantum well comprises an InGaN quantum well, and the second continuous layer of second conductivity type semiconductor comprises a p-GaN layer.

2. The device of claim 1, further comprising a second electrode layer which electrically connects to the n-type nanowire cores.

3. The device of claim 1, wherein the first electrode layer is transparent.

4. The device of claim 1, wherein a top portion of the second layer of the second conductivity type semiconductor is substantially planar.

5. The device of claim 1, wherein the interstitial voids are encapsulated within the second continuous layer of the second conductivity type semiconductor.

6. The device of claim 1, wherein the first continuous layer of second conductivity type semiconductor comprises a p-AlGaN layer.

* * * * *